United States Patent
Cho et al.

(10) Patent No.: US 11,282,832 B2
(45) Date of Patent: Mar. 22, 2022

(54) DISPLAY DEVICE

(71) Applicant: SAMSUNG DISPLAY CO., LTD., Yongin-Si (KR)

(72) Inventors: Kyong-Hun Cho, Hwaseong-si (KR); Joo Sun Yoon, Seoul (KR); Woo Sik Jun, Seongnam-si (KR); Yun-Mo Chung, Yongin-Si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 396 days.

(21) Appl. No.: 16/535,366

(22) Filed: Aug. 8, 2019

(65) Prior Publication Data

US 2020/0119125 A1 Apr. 16, 2020

(30) Foreign Application Priority Data

Oct. 11, 2018 (KR) .................. 10-2018-0121116

(51) Int. Cl.
*H01L 27/02* (2006.01)
*H01L 27/32* (2006.01)
(Continued)

(52) U.S. Cl.
CPC ...... *H01L 27/0266* (2013.01); *H01L 27/0292* (2013.01); *H01L 27/1218* (2013.01);
(Continued)

(58) Field of Classification Search
CPC ... H01L 27/0266–0285; H01L 27/0292; H01L 27/0296; H01L 29/0603–0653; G02F 1/136204
See application file for complete search history.

(56) References Cited

U.S. PATENT DOCUMENTS

2015/0001626 A1* 1/2015 Sokabe ............... H01L 27/0266
  257/357
2016/0197132 A1* 7/2016 Cho ...................... H01L 23/60
  257/40
(Continued)

FOREIGN PATENT DOCUMENTS

KR  10-2014-0032155  3/2014
KR  10-2015-0059478  6/2015
(Continued)

*Primary Examiner* — Scott B Geyer
(74) *Attorney, Agent, or Firm* — F. Chau & Associates, LLC

(57) ABSTRACT

According to an exemplary embodiment of the present invention, a display device includes a static electricity blocking circuit having a first conductive layer, a first semiconductor portion, a second semiconductor portion, a channel portion disposed therebetween, a first electrode connected to the first semiconductor portion through first signal line contact holes, and a second electrode connected to the second semiconductor portion through first power line contact holes. The first signal line contact holes are disposed closer to an outermost edge of the first semiconductor portion than an innermost edge thereof. The first power line contact holes are disposed closer to an outermost edge of the second semiconductor portion than an innermost edge thereof. The second conductive layer is closer to the innermost edge of the first semiconductor portion than the outermost edge thereof and is closer to the innermost edge of the second semiconductor portion than the outermost edge thereof.

20 Claims, 10 Drawing Sheets

(51) Int. Cl.
*H01L 27/12* (2006.01)
*G09G 3/3275* (2016.01)
*G02F 1/1362* (2006.01)
*H01L 29/06* (2006.01)

(52) U.S. Cl.
CPC .... *H01L 27/3276* (2013.01); *G02F 1/136204* (2013.01); *G09G 3/3275* (2013.01); *H01L 29/0603* (2013.01)

(56) References Cited

U.S. PATENT DOCUMENTS

| | | | | |
|---|---|---|---|---|
| 2018/0212051 | A1* | 7/2018 | Wu | G02F 1/133305 |
| 2020/0303485 | A1* | 9/2020 | Jin | H01L 51/5246 |
| 2020/0349877 | A1* | 11/2020 | Xiao | G09G 3/20 |
| 2021/0305236 | A1* | 9/2021 | Chen | H01L 27/124 |

FOREIGN PATENT DOCUMENTS

| | | |
|---|---|---|
| KR | 10-2016-0002337 | 1/2016 |
| KR | 10-2016-0031065 | 3/2016 |
| KR | 10-2016-0040345 | 4/2016 |
| KR | 10-1741732 | 5/2017 |
| KR | 10-2017-0125160 | 11/2017 |
| KR | 10-2018-0003707 | 1/2018 |

* cited by examiner

DISPLAY DEVICE

CROSS-REFERENCE TO RELATED APPLICATION

This application claims priority to and the benefit of Korean Patent Application No. 10-2018-0121116 filed in the Korean Intellectual Property Office on Oct. 11, 2018, the entire contents of which are incorporated by reference herein.

BACKGROUND

(a) Field

The present invention relates to a display device. More particularly, the present invention relates to a display device having a static electricity blocking circuit to block static electricity.

(b) Description of the Related Art

Recently, various display devices such as a liquid crystal display device and an organic light emitting display device have been commercially available.

Such a display device includes a display panel in which a plurality of pixels and wires are disposed on an insulation substrate. The display panel includes a display area, in which the plurality of pixels are disposed to display an image, and a peripheral area, in which a pad and the wires for supplying power to the display area are disposed.

The plurality of pixels and the pad and the wires for supplying power are formed on the insulating substrate, so that static electricity cannot be discharged to the outside of the insulating substrate, and may flow into the display area through the wires disposed in the peripheral area and damage an insulating layer, a thin film transistor, and the like of the pixel. That is, the display panel may be very vulnerable to the static electricity, and the display panel may have a defect caused by the static electricity.

The above information disclosed in this Background section is only for enhancement of understanding of the background of the invention and therefore it may contain information that does not form the prior art that is already known in this country to a person of ordinary skill in the art.

SUMMARY

According to an exemplary embodiment of the present invention, a display device includes a static electricity blocking circuit connecting a scan line to a power line. The static electricity blocking circuit includes a first conductive layer, a semiconductor layer including a first semiconductor portion overlapping the scan line, a second semiconductor portion overlapping the power line, and a channel portion disposed therebetween, a second conductive layer disposed on the channel portion, a first electrode connected to the first semiconductor portion through first signal line contact holes, and a second electrode connected to the second semiconductor portion through first power line contact holes. The first signal line contact holes are disposed closer to an outermost edge of the first semiconductor portion than an innermost edge thereof. The first power line contact holes are disposed closer to an outermost edge of the second semiconductor portion than an innermost edge thereof. The second conductive layer is closer to the innermost edge of the first semiconductor portion than the outermost edge thereof and is closer to the innermost edge of the second semiconductor portion than the outermost edge thereof.

According to an exemplary embodiment of the present invention, a display device includes a display portion that includes pixels, a gate driver that is connected to scan lines and sensing lines that are connected to the pixels and extend in a first direction, a static electricity blocking circuit portion that is disposed between the gate driver and the display portion to block introduction of static electricity into the display portion through at least one of the scan lines, static electricity discharge transistors each of which connecting a corresponding one of the plurality of scan lines to a power line. Each static electricity discharge transistor includes a semiconductor layer that includes a first semiconductor portion, a second semiconductor portion, and a channel portion that connects the first semiconductor portion and the second semiconductor portion with each other, a gate electrode that overlaps the channel portion, a first electrode that is connected to the first semiconductor portion through first signal line contact holes, and a second electrode that is connected to the second semiconductor portion through first power line contact holes. The first signal line contact holes are disposed closer to an outermost edge of the first semiconductor portion than an innermost edge thereof and overlap the first semiconductor portion. The first power line contact holes are disposed closer to an outermost edge of the second semiconductor portion than an innermost edge thereof and overlap the second semiconductor portion. The gate electrode is closer to the innermost edge of the first semiconductor portion than the outermost edge thereof and is closer to the innermost edge of the second semiconductor portion than the outermost edge thereof.

DETAILED DESCRIPTION

Figure 1:
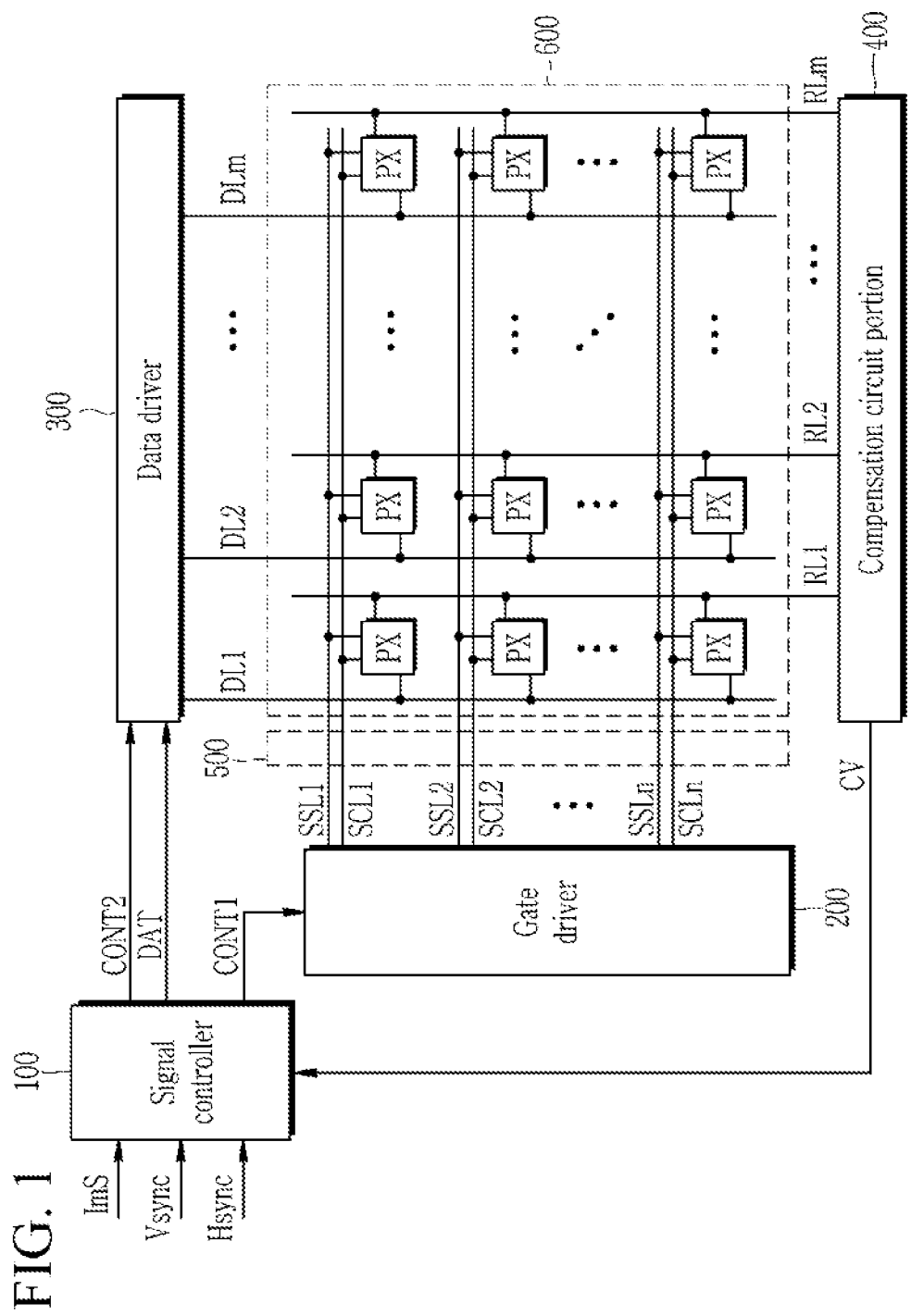
FIG. 1 is a block diagram of a display device according to an exemplary embodiment of the present invention.

Hereinafter, exemplary embodiments of the present invention will be described in more detail with reference to the accompanying drawings. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present invention is not limited thereto. In the drawings, the thicknesses of several layers and regions, etc., are exaggerated for clarity. In the drawings, the thickness of some layers and regions are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In this specification, the phrase "on a plane" means viewing a target portion from the top, and the phrase "on a cross-section" means viewing a cross-section formed by vertically cutting a target portion from the side.

Also, throughout the specification, when something is referred to as being "overlapped", this means that it is overlapped on the cross-section, or all or part of the plane is located in the same area.

Hereinafter, referring to FIG. 1 and FIG. 2, a display device according to an exemplary embodiment of the present invention will be described.

FIG. 1 is a block diagram of a display device according to an exemplary embodiment of the present invention.

Referring to FIG. 1, the display device includes a signal controller 100, a gate driver 200, a data driver 300, a compensation circuit portion 400, a static electricity blocking circuit portion 500, and a display portion 600.

The signal controller 100 receives a video signal ImS and a synchronization signal from an external device. The video signal ImS contains luminance information of a plurality of pixels PX. The luminance has a predetermined number of gray levels, for example, $1024=2^{10}$, $256=2^8$, or $64=2^6$. The synchronization signal may include a horizontal synchronization signal Hsync and a vertical synchronization signal Vsync.

The signal controller 100 divides the video signal ImS by frame units according to the vertical synchronization signal Vsync, and divides the video signal ImS by scan lines SCL1 to SCLn according to the horizontal synchronization signal Hsync. The signal controller 100 may appropriately process the video signal ImS according to operation conditions of the display portion 600 and the data driver 300 based on the synchronization signal, and may generate a video data signal DAT, a first control signal CONT1, and a second control signal CONT2. The signal controller 100 transmits the first control signal CONT1 to the gate driver 200. The signal controller 100 transmits the second control signal CONT2 and the video data signal DAT to the data driver 300.

The display portion 600 includes a plurality of scan lines SCL1 to SCLn, a plurality of sensing lines SSL1 to SSLn, a plurality of data lines DL1 to DLm, a plurality of receiving lines RL1 to RLm, and a plurality of pixels PX. The plurality of pixels PX may be connected to the plurality of scan lines SL1 to SLn, the plurality of sensing lines SSL1 to SSLn, the plurality of data lines DL1 to DLm, and the plurality of receiving lines RL1 to RLm. The plurality of scan lines SCL1 to SCLn extend substantially in a row direction and thus may be almost parallel with each other. The plurality of sensing lines SSL1 to SSLn extend substantially in the row direction and thus may be almost parallel with each other. The plurality of data lines DL1 to DLm extend substantially in a column direction and thus may be almost parallel with each other. The plurality of receiving lines RL1 to RLm extend substantially in the column direction and thus may be almost parallel with each other. The display portion 600 may be a display area where an image is displayed.

Although it is not illustrated, a first power source voltage ELVDD and a second power source voltage ELVSS may be supplied to the display portion 600. The first power source voltage ELVDD may be a high-level voltage supplied to an anode of a light emitting diode LED (refer to FIG. 2) included in each of the plurality of pixels PX. The second power source voltage ELVSS may be a low-level voltage supplied to a cathode of the light emitting diode LED included in each of the plurality of pixels PX. The first power source voltage ELVDD and the second power source voltage ELVSS are driving voltages for light emission of the plurality of pixels PX.

The gate driver 200 is connected to the plurality of scan lines SCL1 to SCLn and the plurality of sensing lines SSL1 to SSLn. The gate driver 200 applies a scan signal, which is a combination of a gate-on voltage and a gate-off voltage, to the plurality of scan lines SCL1 to SCLn, and applies a sensing signal, which is a combination of a gate-on voltage and a gate-off voltage, to the plurality of sensing lines SSL1 to SSLn according to the first control signal CONT1. The gate driver 200 may sequentially apply a scan signal of the gate-on voltage to the plurality of scan lines SCL1 to SCLn. The gate driver 200 may sequentially apply a sensing signal of the gate-on voltage to the plurality of sensing lines SSL1 to SSLn.

The data driver 300 is connected to the plurality of data lines DL1 to DLm, and it samples and holds the video data signal DAT according to the second control signal CONT2, and applies a data voltage Vdat (refer to FIG. 2) to the plurality of data lines DL1 to DLm. The data driver 300 may apply a data voltage Vdat having a predetermined voltage range to the plurality of data lines DL1 to DLm corresponding to a gate signal of the gate-on voltage.

The compensation circuit portion 400 is connected with the plurality of receiving lines RL1 to RLm, and receives a current flowing to the plurality of pixels through the plurality of receiving lines RL1 to RLm. The compensation circuit portion 400 measures a threshold voltage of a driving transistor TR1 (refer to FIG. 2) included in each of the plurality of pixels PX based on the received current, and calculates a threshold voltage change amount. The compensation circuit portion 400 may determine deterioration of each of the driving transistors TR1 included in the plurality of pixels, and calculate a deviation in the plurality of driving transistors TR1 based on the threshold voltage change amount of the driving transistors TR1. The compensation circuit portion 400 may generate a compensation value CV based on the deterioration and deviation of the plurality of driving transistors TR1, and provide the compensation value CV to the signal controller 100.

The signal controller 100 generates a video data signal DAT from the video signal ImS based on the compensation value CV. The signal controller 100 may avoid image quality deterioration due to deterioration of the driving transistor TR1 by applying the compensation value CT to the video signal ImS.

In FIG. 1, the compensation circuit portion 400 is formed separately from the signal controller 100, but the compensation circuit portion 400 may be included in the signal controller 100 depending on exemplary embodiments.

The static electricity blocking circuit portion 500 is disposed between the gate driver 200 and the display portion 600 to prevent static electricity from being introduced into the display portion 600 through the plurality of scan lines SCL1 to SCLn and the plurality of sensing lines SSL1 to SSLn. The static electricity blocking circuit portion 500 may include a plurality of static electricity blocking circuits each of which connecting a corresponding one of the plurality of scan lines SCL1 to SCLn via a static electricity discharge transistor to a power line PL (refer to FIG. 3). The static electricity blocking circuit portion 500 is disposed between the gate driver 200 and the display portion 600. For example, the static electricity discharge transistor may be turned on due to static charges on the corresponding one of the scan lines SCL1 to SCLn so that the static charges are discharged to the power line PL. Alternatively, the static electricity blocking circuit portion 500 may include a plurality of static electricity blocking circuits each of which connecting a corresponding one of the plurality of sensing lines SSL1 to SSL via a static electricity discharge transistor to the power line PL. The static electricity blocking circuit portion 500 is disposed between the gate driver 200 and the display portion 600. In FIG. 1, the power line PL is not illustrated for simplification of the drawing, but a plurality of power lines PL may be disposed respectively adjacent to the plurality of scan lines SCL1 to SCLn and the plurality of sensing lines SSL1 to SSLn. Specific exemplary embodiments of the static electricity blocking circuit portion 500 will be described later with reference to FIG. 3 to FIG. 10.

Figure 2:
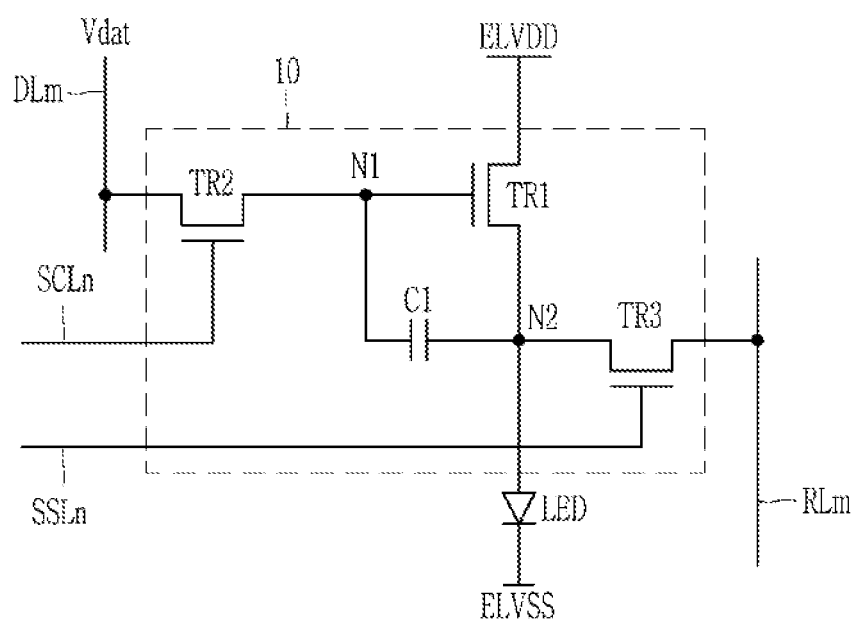
FIG. 2 is a circuit diagram of a pixel included in the display device of FIG. 1 according to an exemplary embodiment.

FIG. 2 is a circuit diagram of a pixel according to an exemplary embodiment, included in the display device of FIG. 1. Among the plurality of pixels PX included in the display device of FIG. 1, a pixel located in an n-th pixel row and in an m-th pixel column will be exemplarily illustrated.

Referring to FIG. 2, a pixel PX includes a light emitting diode LED and a pixel circuit 10.

The pixel circuit 10 controls a current flowing to the light emitting diode LED from the first power source voltage ELVDD. The pixel circuit 10 may include a driving transistor TR1, a switching transistor TR2, a sensing transistor TR3, and a sustain capacitor C1.

The driving transistor TR1 includes a gate electrode connected to a first node N1, a first electrode connected to the first power source voltage ELVDD, and a second electrode connected to a second node N2. The driving transistor TR1 is connected between the first power source voltage ELVDD and the light emitting diode LED, and controls a current amount flowing to the light emitting diode LED from the first power source voltage ELVDD corresponding to a voltage of the first node N1.

The switching transistor TR2 includes a gate electrode connected to a scan line SCLn, a first electrode connected to a data line data line DLm, and a second electrode connected to the first node N1. The switching transistor TR2 is connected between the data line DLm and the driving transistor TR1, is turned on according to a scan signal of the gate-on voltage applied to the scan line SCLn, and transmits a data voltage Vdat applied to the data line DLm to the first node N1.

The sensing transistor TR3 includes a gate electrode connected to a sensing line SSLn, a first electrode connected to the second node N2, and a second electrode connected to a receiving line RLm. The sensing transistor TR3 is connected between the second electrode of the driving transistor TR1 and the receiving line RLm, and is turned on according to a sensing signal of the gate-on voltage, applied to the sensing line SSLn, and transmits a current flowing through the driving transistor TR1 to the receiving line RLm.

The driving transistor TR1, the switching transistor TR2, and the sensing transistor TR3 may be n-channel field effect transistors. A gate-on voltage that turns on the n-channel field effect transistor is a high-level voltage, and a gate-off voltage that turns off the n-channel field effect transistor is a low-level voltage. Depending on exemplary embodiments, at least one of the driving transistor TR1, the switching transistor TR2, and the sensing transistor TR3 may be a p-channel field effect transistor. A gate-on voltage that turns on the p-channel field effect transistor is a low-level voltage, and a gate-off voltage that turns off the p-channel field effect transistor is a high-level voltage.

A sustain capacitor C1 includes a first electrode connected to the first node N1 and a second electrode connected to the second node N2. The data voltage Vdat is transmitted to the first node N1, and the sustain capacitor C1 maintains a voltage of the first node N1 that corresponds to the data voltage Vdat.

The light emitting diode LED includes an anode connected to the second node N2 and a cathode connected to the second power source voltage ELVSS. The light emitting diode LED is connected between the pixel circuit 10 and the second power source voltage ELVSS, and may emit light with luminance that corresponds to a current supplied from the pixel circuit 10. The light emitting diode LED may include an emission layer that includes at least one of an organic light emitting material and an inorganic light emitting material. A hole and an electron are injected into the emission layer from an anode and a cathode, respectively, and an exciton formed by coupling the injected hole and electron falls from an excited state to a ground state to emit light. The light emitting diode LED may emit light of one of primary colors or emit white light. The primary colors may be, for example, three primary colors of red, green, and blue. Another example of the primary colors may be yellow, cyan, and magenta.

Hereinafter, the static electricity blocking circuit portion according to the exemplary embodiment will be described with reference to FIG. 3 and FIG. 4.

Figure 3:
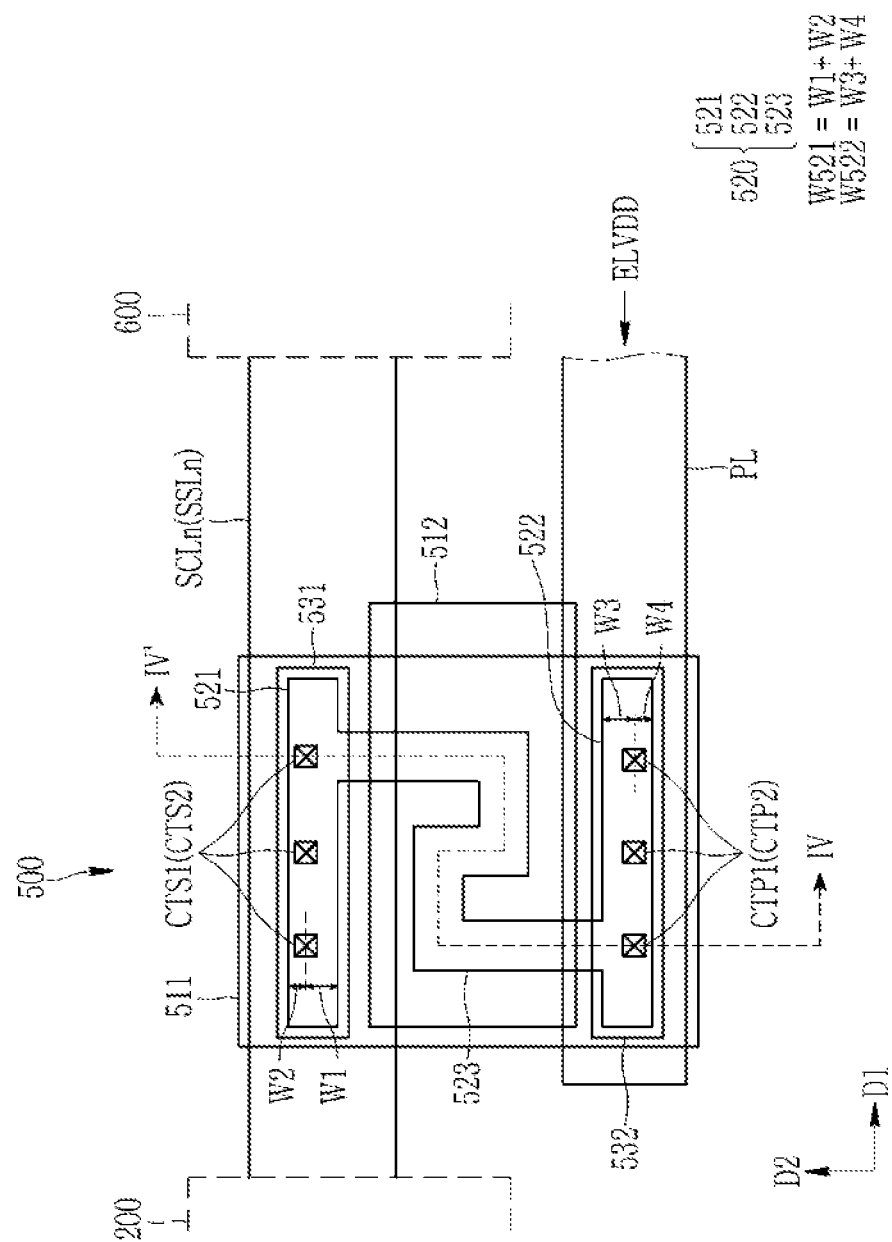
FIG. 3 is a top plan view of a static electricity blocking circuit portion according to an exemplary embodiment of the present invention.

FIG. 3 is a top plan view of the static electricity blocking circuit portion according to the exemplary embodiment of the present invention. FIG. 4 is a cross-sectional view of the static electricity blocking circuit of FIG. 3, taken along the line IV-IV'.

A static electricity blocking circuit that connects an n-th scan line SCLn among the plurality of scan lines SCL1 to SCLn included in the display device of FIG. 1 to the power line PL will be exemplarily described. Such a static electricity blocking circuit may be applied to the plurality of scan lines SCL1 to SCLn and the plurality of sensing lines SSL1 to SSLn.

Figure 4:
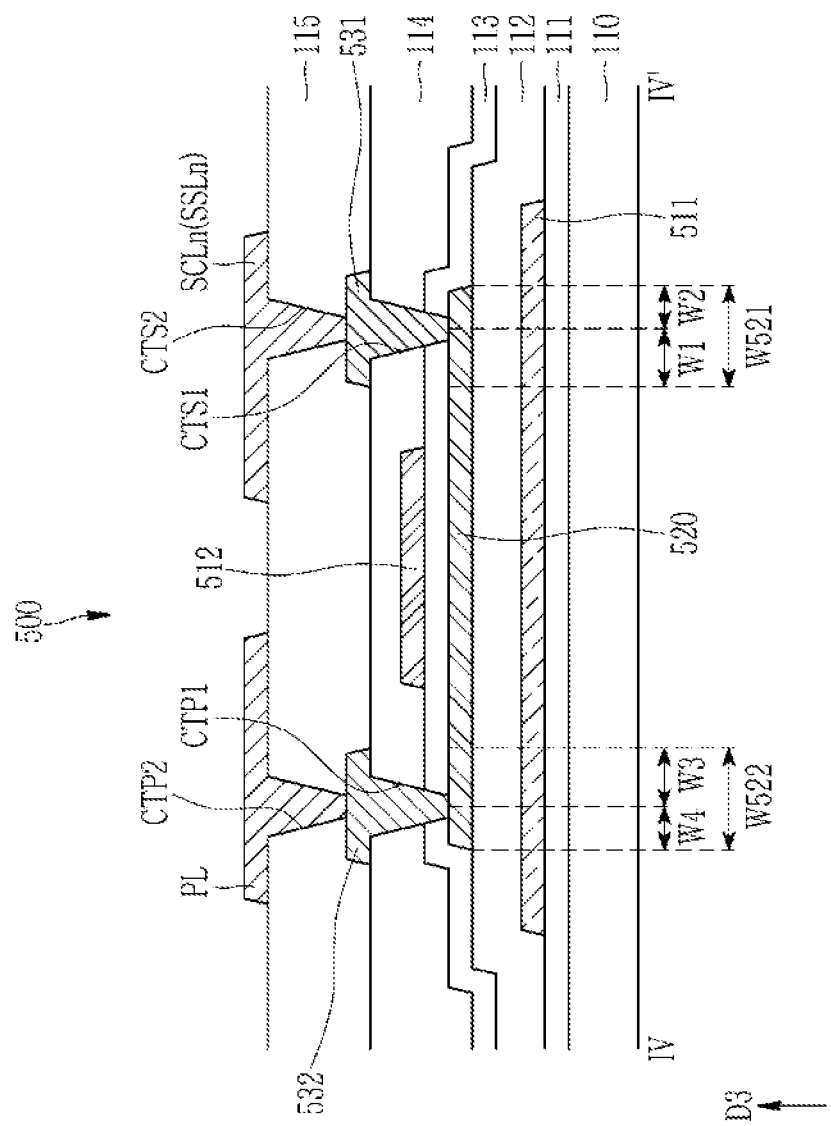
FIG. 4 is a cross-sectional view of the static electricity blocking circuit portion of FIG. 3, taken along the line IV-IV'.

Referring to FIG. 3 and FIG. 4, each of the static electricity blocking circuits included in the static electricity blocking circuit portion 500 may be disposed on a substrate 110 at a peripheral area that surrounds the display portion 600. The static electricity blocking circuit includes a first conductive layer 511, a semiconductor layer 520, a second conductive layer 512, a first electrode 531, and a second electrode 532.

The substrate 110 may include a material such as glass, plastic, or polyimide (PI). A barrier layer 111 is disposed on the substrate 110, and the first conductive layer 511 made of a semiconductor material including a conductive metal or having the same conductive property as the conductive metal is disposed on the barrier layer 111. The first conductive layer 511 may overlap the semiconductor layer 520, the second conductive layer 512, the first electrode 531, and the second electrode 532. In addition, the first conductive layer 511 may overlap the scan line SCLn (or the sensing line SSLn) and the power line PL.

In a description hereinafter, the scan line SCLn may be replaced with the sensing line SSLn since the configuration of the static electricity blocking circuit may be applied to each of the plurality of sensing lines SSL1 to SSLn.

The scan line SCLn may extend in a first direction D1 from the gate driver 200 and thus may be connected to the display portion 600. The first direction D1 may be a row direction. The power line PL may extend in the first direction D1 adjacent to the scan line SCLn at the peripheral area. The power supply line PL may extend in the first direction D1 adjacent to the scan line SCLn in the peripheral region. The first power source voltage ELVDD may be applied to the power line PL. Depending on exemplary embodiments, the second power source voltage ELVSS or a ground voltage may be applied to the power line PL. Alternatively, a predetermined reference voltage may be applied to the power line PL. The power line PL may be connected to an external device of the display device or a power supply (not shown) at the peripheral area rather than being connected to the display portion 600.

A buffer layer 112 is disposed on the first conductive layer 511. The barrier layer 111 and the buffer layer 112 may include an inorganic insulation material such as a silicon oxide, a silicon nitride, an aluminum oxide, and the like. Alternatively, the barrier layer 111 and the buffer layer 112 may include an organic insulation material such as polyimide, polyacryl (epoxy added), and the like.

The semiconductor layer 520 is disposed on the buffer layer 112. The semiconductor layer 520 may include a first semiconductor portion 521 that overlaps the scan line SCLn, a second semiconductor portion 522 that overlaps the power line PL, and a channel portion 523 that connects the first semiconductor portion 521 and the second semiconductor portion 522 with each other. The first semiconductor portion 521 may have a shape that extends in the first direction D1. The first semiconductor portion 521 overlaps the scan line SCLn. The second semiconductor portion 522 may have a shape that extends in the first direction D1, while overlapping the power line PL. The channel portion 523 may be zigzag-shaped or S-shaped between the first semiconductor portion 521 and the second semiconductor portion 522 on a plane. For example, the channel portion 523 may extend in the first direction D1 after extending in a second direction D2 from the first semiconductor portion 521, extend in the first direction D1 after extending in the second direction D2, and then extend in the second direction D2 after extending in the first direction D1, and thus may be connected to the second semiconductor portion 522. The channel portion 523 may wholly overlap the second conductive layer 512.

In the description hereinafter, the second direction D2 crosses the first direction D1, and a third direction D3 may be a direction perpendicular to a plane formed by the first direction D1 and the second direction D2. The second direction D2 may be perpendicular to the first direction D1. The second direction D2 may be the column direction. In addition, a width, which will be described later, implies a gap or a distance in the second direction D1 on a plane formed by the first direction D1 and the second direction D1. Further, a thickness, which will be described later, implies a gap or distance in the third direction D3.

A first gate insulation layer 113 is disposed on the semiconductor layer 520. A thickness of the first gate insulation layer 113 may be smaller than a thickness of the buffer layer 112. For example, the thickness of the first gate insulation layer 113 may be about 0.12 µm to about 0.14 µm, and the thickness of the buffer layer 112 may be about 0.3 µm to about 0.4 µm.

The second conductive layer 512 is disposed on the first gate insulation layer 113. On a plane, the second conductive layer 512 is disposed between the first semiconductor portion 521 and the second semiconductor portion 522 of the semiconductor layer 520, and thus overlaps the channel portion 523 of the semiconductor layer 520. An interlayer insulation layer 114 is disposed on the second conductive layer 512. The second conductive layer 512 is insulated from other conductors by the first gate insulation layer 113 and the interlayer insulation layer 114. That is, the second conductive layer 512 is floated without being applied with a voltage.

The first electrode 531 and the second electrode 532 are disposed on the interlayer insulation layer 114. The first electrode 531 overlaps the first semiconductor portion 521 of the semiconductor layer 520. The first electrode 531 may be connected to the first semiconductor portion 521 through first signal line contact holes CTS1 formed in the first gate insulation layer 113 and the interlayer insulation layer 114. The second electrode 532 overlaps the second semiconductor portion 522 of the semiconductor layer 520. The second electrode 532 may be connected to the second semiconductor portion 522 through first power line contact holes CTP1 formed in the first gate insulation layer 113 and the interlayer insulation layer 114.

A planarization layer 115 is disposed on the first electrode 531 and the second electrode 532, and the scan line SCLn and the power line PL are disposed on the planarization layer 115. The planarization layer 115 may include an inorganic insulating material or an organic insulating material.

The scan line SCLn is connected to the first electrode 531 through a plurality of second signal line contact holes CTS2 formed in the planarization layer 115. The scan line SCLn overlaps the first electrode 531. The second signal line contact holes CTS2 overlap the first signal line contact holes CTS1. The scan line SCLn partially overlaps the second conductive layer 512, and accordingly, the scan line SCLn and the second conductive layer 512 may form a capacitor.

The power line PL is connected to the second electrode 532 through a plurality of second power line contact holes CTP2 formed in the planarization layer 115. The power line PL overlaps the second electrode 532. The second power line contact holes CTP2 overlap the first power line contact holes CTP1. The power line PL may partially overlap the second conductive layer 512, and accordingly, the power line PL and the second conductive layer 512 may form a capacitor.

The first signal line contact holes CTS1 and the second signal line contact holes CTS2 may be respectively provided in plural, and the plurality of first signal line contact holes CTS1 and the plurality of second signal line contact holes CTS2 may be arranged in the first direction D1. The first signal line contact holes CTS1 and the second signal line contact holes CTS2 overlap the first semiconductor portion 521. The first power line contact holes CTP1 and the second power line contact holes CTP2 may be respectively provided in plural, and the plurality of first power line contact holes CTP1 and the plurality of second power line contact holes CTP2 may be arranged in the first direction D1. The first power line contact holes CTP1 and the second power line contact holes CTP2 overlap the second semiconductor portion 522.

The semiconductor layer 520, the second conductive layer 512, the first electrode 531, and the second electrode 532 may form a static electricity discharge transistor having the second conductive layer 512 as a gate electrode. The scan line SCLn and the power line PL may be connected to each other through the static electricity discharge transistor. That is, the scan line SCLn is connected to the power line PL through the first electrode 531, the semiconductor layer 520, and the second electrode 532. However, when resistance of the semiconductor layer 520 is higher than that of the scan line SCLn or the power line PL, and the second conductive layer 512 is floated, a scan signal of the scan line SCLn is not transmitted to the power line PL and the first power source voltage ELVDD of the power line PL is not transmitted to the scan line SCLn in a normal state. That is, normally, the static electricity discharge transistor is maintained to be turned off.

When static electricity is introduced to the scan line SCLn, a voltage of the second conductive layer 512 is increased and the static electricity discharge transistor is turned on due to coupling by a capacitor formed by the scan line SCLn and the second conductive layer 512. The static electricity introduced to the scan line SCLn flows to the power line PL through the static electricity discharge transistor, and thus static electricity may be prevented from flowing to the display portion 600.

Meanwhile, when the first semiconductor portion 521 of the semiconductor layer 520 is formed in a shape that extends in the first direction D1, the first signal line contact hole CTS1 in a width W521 of the first semiconductor portion 521 overlaps the first semiconductor portion 521 rather than being disposed at a center of the width W521 of the first semiconductor portion 521. The first signal line contact holes CTS1 may be disposed between the center of the width W521 of the first semiconductor portion 521 and an outermost edge in the second direction D2 (upward direction in FIG. 3) of the semiconductor layer 520. That is, when a distance from the first signal line contact hole CTS1 to an innermost edge of the first semiconductor portion 521, close to the second conductive layer 512, is a first width W1 of the first semiconductor portion 521, and a distance from the outermost edge of the first semiconductor portion 521, which is relatively away from the second conductive layer 512, is a second width W2 of the first semiconductor portion 521. The first width W1 may be greater than the second width W2. The innermost edge of the first semiconductor portion 521 and the outermost edge thereof are opposite to each other in the second direction D2. The first width W1 may be a first margin where the first signal line contact holes CTS1 may be located in the second direction D2 (downward direction) in a manufacturing process. The sum of the second width W2 and a minimum width of the first signal line contact hole CTS1 may become a second margin where the first signal line contact holes CTS1 may be located in the second direction (upward direction). The minimum width of the first signal line contact hole CTS1 implies a width of a portion of the first signal line contact hole CTS1, contacting an upper surface of the semiconductor layer 520 in the second direction D2 (or a horizontal direction). The first width W1 or the first margin may be greater than the second margin.

In addition, when the second semiconductor portion 522 of the semiconductor layer 520 is formed in a shape that extends in the first direction D1, the first power line contact hole CTP1 in the width W522 of the second semiconductor portion 522 overlaps the second semiconductor portion 522 rather than being disposed at a center of the width W522 of the second semiconductor portion 522. The first power line contact hole CTP1 may be disposed between the center of the width W522 of the second semiconductor portion 522 and an outermost edge of the semiconductor layer 520 in the second direction D2 (downward direction in FIG. 3). That is, when a distance from the first power line contact hole CTP1 to an innermost edge of the second semiconductor portion 522, close to the second conductive layer 512, is a third width W3, and a distance from the first power line contact hole CTP1 to the outermost edge of the second semiconductor portion 522, which is relatively away from the second conductive layer 512, is a fourth width W4. The third width W3 may be greater than the fourth width W4. The innermost edge of the second semiconductor portion 522 is opposite to the outermost edge thereof in the second direction. The third width W3 may equal the first width W1 in size, and the fourth width W4 may equal the second width W2 in size. In the manufacturing process, the third width W3 may be a third margin where the first power line contact holes CTP1 may be located in the second direction (upward direction). The sum of the fourth W4 and a minimum width of the first power line contact hole CTP1 may become a fourth margin where the first power line contact holes CTP1 can be located in the second direction (downward direction) in the manufacturing process. The minimum width of the first power line contact hole CTP1 implies a width of a portion of the first power line contact hole CTP1, contacting a top surface of the semiconductor layer 520 in the second direction D2 (or a horizontal direction). The third width W3 may be greater than the fourth margin.

A structure in which the first signal line contact holes CTS1 are not disposed at the center of the width W521 of the first semiconductor portion 521 and the first power line contact holes CTP1 are not disposed at the center of the width W522 of the second semiconductor portion 522 is referred to as an asymmetrical structure of a contact hole. With the asymmetric structure of the contact hole, a failure of the static electricity blocking circuit portion 500, which may occur due to a process variation during the manufacturing process of the display device, may be prevented. This will be described with reference to FIG. 5 and FIG. 6.

Figure 5:
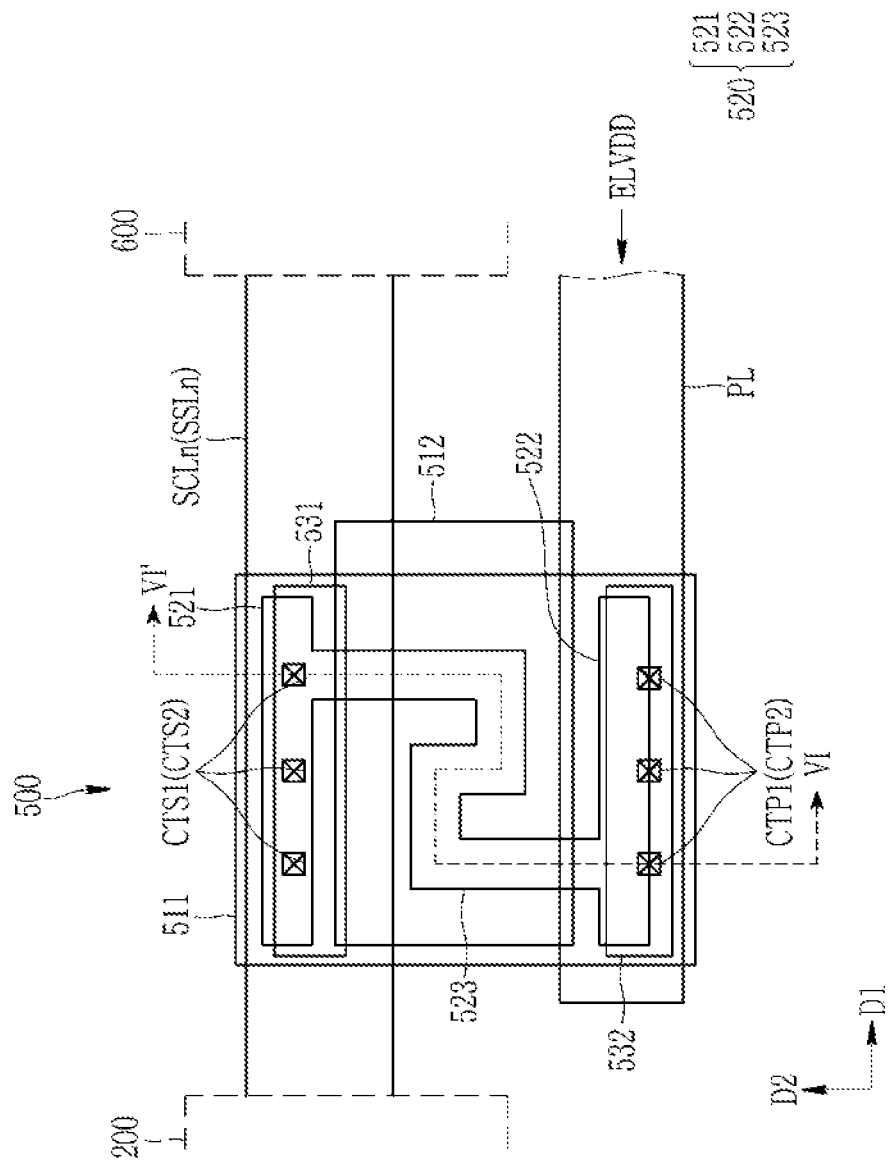
FIG. 5 is an exemplary top plan view of a process variation, which may occur during a process for manufacturing the static electricity blocking circuit portion of FIG. 3.
Figure 6:
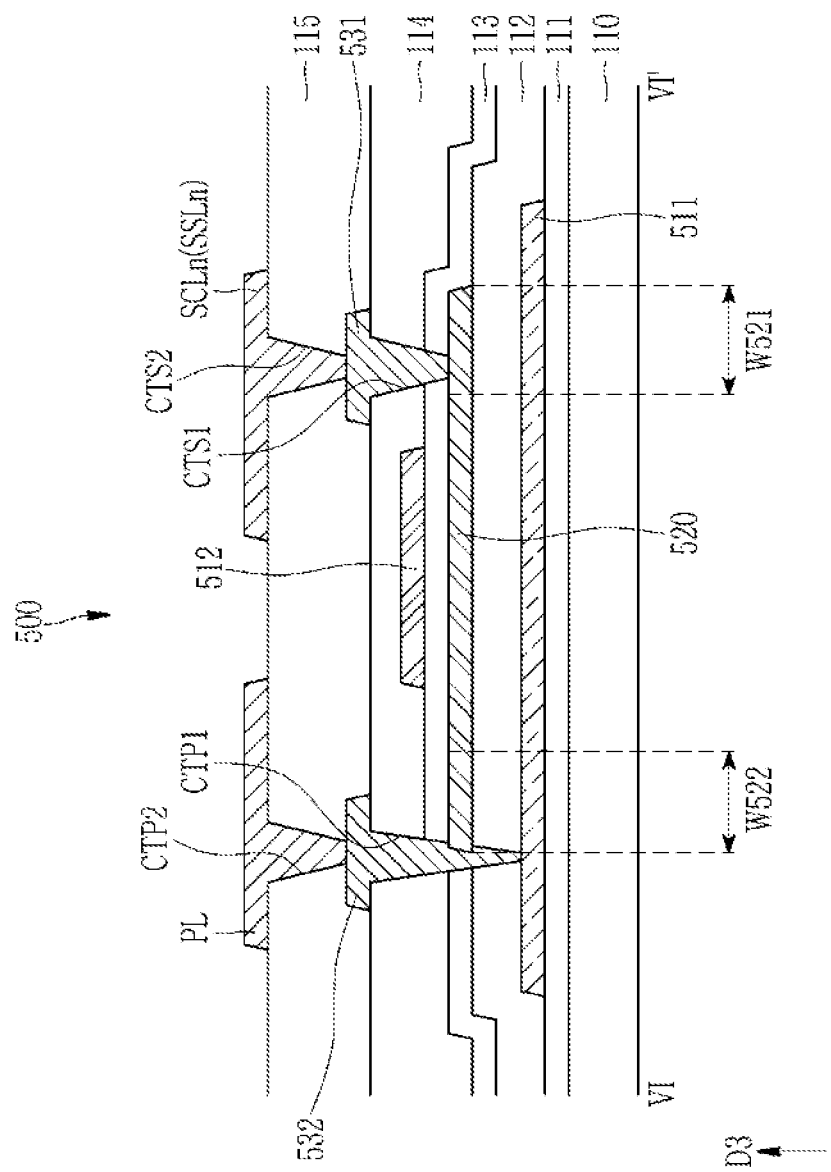
FIG. 6 is a cross-sectional view of the static electricity blocking circuit portion of FIG. 5, taken along the line VI-VI'.

FIG. 5 is a top plan view of a process variation which may occur during a manufacturing process of the static electricity blocking circuit portion of FIG. 3. FIG. 6 is a cross-sectional view of the static electricity blocking circuit portion of FIG. 5, taken along the line VI-VI'. A difference compared with FIG. 3 and FIG. 4 will be mainly described.

Referring to FIG. 5 and FIG. 6, during the manufacturing process of the display device, the barrier layer 111, the first conductive layer 511, the buffer layer 112, the semiconductor layer 520, the first gate insulation layer 113, the second conductive layer 512, and the interlayer insulation layer 114 may be sequentially formed on the substrate 110. Next, an etching process using a mask is carried out on the first gate insulation layer 113 and the interlayer insulation layer 114 to form the first signal line contact holes CTS1 and the first power line contact holes CTP1. When a process variation occurs during such an etching process, the first signal line contact holes CTS1 and the first power line contact holes CPT1 may be deviated from predetermined locations.

For example, as shown in FIG. 5, the first power line contact holes CTP1 may be sifted in the second direction (downward direction) from the predetermined locations on a plane. Since the first signal line contact holes CTS1 are simultaneously formed with the first power line contact holes CTP1, the first signal line contact holes CTS1 may be shifted in the second direction (downward direction) from the predetermined locations. When the first power line contact holes CTP1 are shifted in the second direction (downward direction) beyond the fourth width W4 in the fourth margin, the first power line contact holes CTP1 are partially shifted from the width W522 of the second semiconductor portion 522 and thus may not be partially overlapped with the second semiconductor portion 522. In such a case, as exemplarily shown in FIG. 6, not only the first gate insulation layer 113 and the interlayer insulation layer 114 but also the buffer layer 112 may be etched together during a process for etching an insulation material by using a mask to thereby form the first power line contact holes CPT1. Accordingly, the first power line contact holes CPT1 may be formed in the first gate insulation layer 113, the interlayer insulation layer 114, and the buffer layer 112.

However, due to the above-described asymmetric structure of the contact hole, the first signal line contact holes CTS1 may be disposed in the first margin, that is, in the width W521 of the first semiconductor portion 521. Accordingly, the first signal line contact holes CTS1 are formed in the first gate insulation layer 113 and the interlayer insulation layer 114. Next, when the first electrode 531 and the second electrode 532 are formed, the second electrode 532 may be connected not only with the second semiconductor portion 522 but also with the first conductive layer 511 through the first power line contact holes CTP1. In this case, the first electrode 531 is connected only to the first semiconductor portion 521 and is not connected to the first conductive layer 511.

When the power line PL is electrically connected to the first conductive layer 511 due to the process variation, the first conductive layer 511 may be applied with the first power source voltage ELVDD, but the static electricity discharge transistor is not turned on by the first power source voltage ELVDD applied to the first conductive layer 511 because it is turned on by static electricity having a higher voltage than the first power source voltage ELVDD. In addition, since a thickness of the buffer layer 112 is thicker than that of the first gate insulation layer 113, the first conductive layer 511 may not function as a gate electrode that can turn on the static electricity discharge transistor.

As described above, even when the power line PL is connected to the first conductive layer 511 due to the process variation occurring due to the asymmetric structure of the contact hole, the scan line SCLn is not connected to the first conductive layer 511, and accordingly a short-circuit between the scan line SCLn and the power line PL through the first conductive layer 511 can be prevented.

However, opposite to the example shown in FIG. 5 and FIG. 6, the first signal line contact holes CTS1 and the first power line contact holes CTP1 may be shifted in the second direction (upward direction) from the predetermined locations. In such a case, when the first signal line contact holes CTS1 are shifted in the second direction (upward direction) from the second width W2 within the second margin, the first power line contact holes CPT1 may be formed in a third margin, that is, the third width W3 of the second semiconductor portion 522. Accordingly, the first signal line contact holes CTS1 are formed in the first gate insulation layer 113, the interlayer insulation layer 114, and the buffer layer 112, and thus when a first electrode 531 is connected to the first conductive layer 511, the first power line contact holes CTP1 are formed in the first gate insulation layer 113 and the interlayer insulation layer 114, and thus a second electrode 532 is not connected to the first conductive layer 511. That is, due to the asymmetrical structure of the contact hole, even when a scan line SCLn is connected to the first conductive layer 511 due to occurrence of the process variation, the power line PL is not connected to the first conductive layer 511, and the scan line SCLn and the power line PL can be prevented from being short-circuited through the first conductive layer 511.

That is, when the first signal line contact holes CTS1 and the first power line contact holes CTP1 are shifted to the second direction D2 (downward direction or upward direction) due to the process variation, the short-circuit between the scan line SCLn and the power line PL through the first conductive layer 11 may be prevented by the asymmetric structure of the contact holes.

As a comparison to the present inventive concept, it may be assumed that the first signal line contact holes CTS1 and the first power line contact holes CTP1 are not arranged according to the asymmetric structure of the contact holes. Instead, the first signal line contact holes CTS1 are assumed to be located at the center of the width W521 of the first semiconductor portion 521 and the first power line contact holes CTP1 are assumed to be located at the center of the width W522 of the second semiconductor portion 522. In this assumption, the first signal line contact holes CTS1 and the first power line contact holes CTP1 are shifted in the second direction D2 from predetermined locations due to the process variation, and thus the first electrode 531 and the second electrode 532 may be connected to the first conductive layer 511.

Accordingly, the scan line SCLn is short-circuited with the power line PL through the first conductive layer 511, and thus a scan signal (or a sensing signal through a sensing line SSLn) may not be normally output through the scan line SCLn.

However, as described above, by the asymmetric structure of the contact hole according to the exemplary embodiment of the present invention, the scan line SCLn and the power line PL may be prevented from being short-circuited through the first conductive layer 511.

Hereinafter, referring to FIG. 7 and FIG. 8, a static electricity blocking circuit portion according to another exemplary embodiment of the present invention will be described. A difference with the above-described exemplary embodiment of FIG. 1 to FIG. 6 will be mainly described, and features that are the same as those described above will be omitted.

Figure 7:
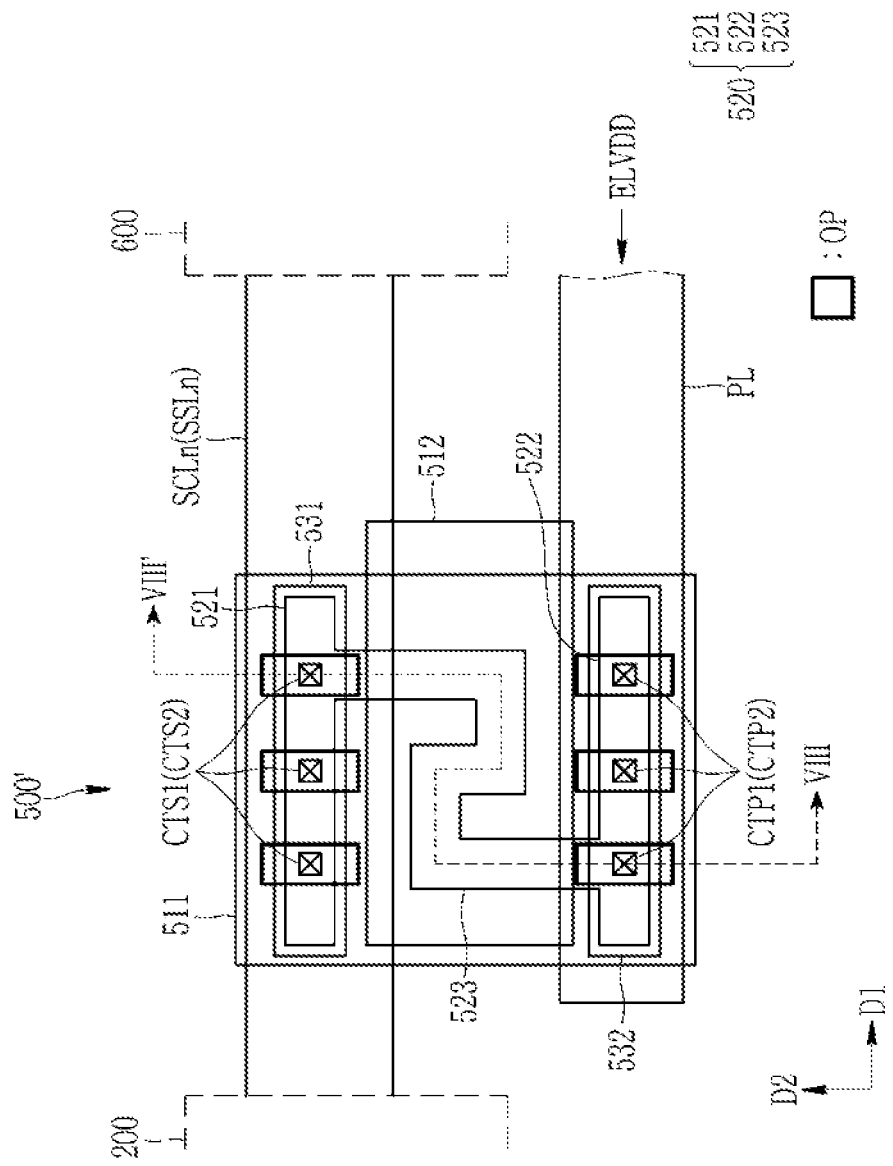
FIG. 7 is a top plan view of a static electricity blocking circuit portion according to another exemplary embodiment of the present invention.

FIG. 7 is a top plan view of a static electricity blocking circuit portion according to another exemplary embodiment of the present invention. FIG. 8 is a cross-sectional view of the static electricity blocking circuit portion of FIG. 7, taken along the line VIII-VIII'.

Figure 8:
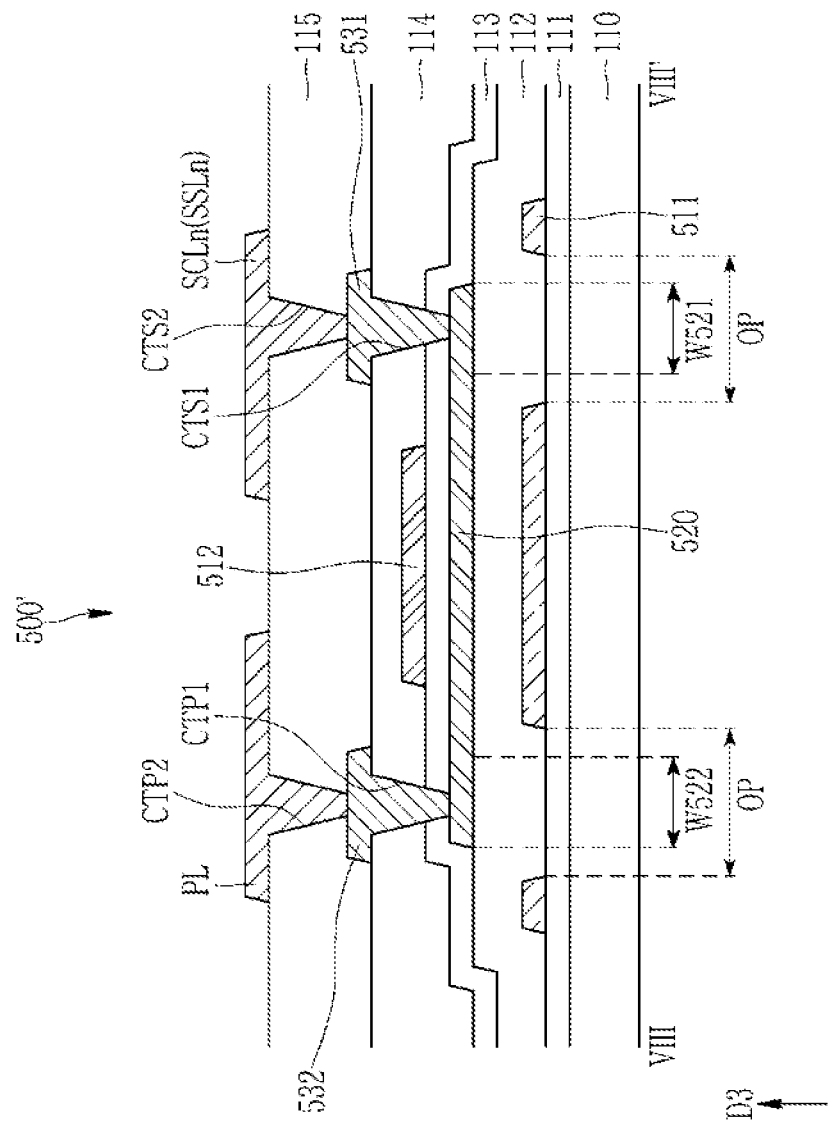
FIG. 8 is a cross-sectional view of the static electricity blocking circuit portion of FIG. 7, taken along the line VIII-VIII'.

Referring to FIG. 7 and FIG. 8, a first conductive layer 511 of a static electricity blocking circuit included in a static electricity blocking circuit portion 500' according to another exemplary embodiment may include a plurality of openings OP that respectively correspond to first signal line contact holes CTS1 and first power line contact holes CTP1. A width of each of the plurality of openings OP in a second direction D2 is greater than a width W521 of a first semiconductor portion 521 and greater than a width W522 of a second semiconductor portion 522. The width of each of the plurality of openings OP may be greater than a margin where the first signal line contact holes CTS1 and the first power line contact holes CTP1 are shifted in the second direction from predetermined locations due to a process variation. The first signal line contact holes CTS1 and the first power line contact holes CTP1 may be formed within a range of the corresponding openings.

The first signal line contact holes CTS1 and the first power line contact holes CTP1 may be shifted to a maximum margin of a process variation in the second direction D2 from the predetermined locations due to the process variation. In this case, although the first signal line contact holes CTS1 are formed not only in a first gate insulation layer 113 and a interlayer insulation layer 114 but also in a buffer layer 112, a first electrode 531 is not connected to a first conductive layer 511 by the opening OP. In addition, although the first power line contact holes CTP1 are formed not only in the first gate insulation layer 113 and the interlayer insulation layer 114 but also in the buffer layer 112, a second electrode 532 is not connected to the first conductive layer 511 by the opening OP.

That is, since the first conductive layer 511 includes the plurality of openings OP that respectively correspond to the first signal line contact holes CTS1 and the first power line contact holes CTP1, even when the first signal line contact holes CTS1 and the first power line contact holes CTP1 are shifted in the second direction D2 from the predetermined locations due to a process variation, a scan line SCLn (or a sensing line SSLn) and the power line PL can be prevented from being short-circuited through the first conductive layer 511.

Except for the difference described above, features of the exemplary embodiments described with reference to FIG. 1 to FIG. 6 may be applied to the exemplary embodiment described with reference to FIG. 7 and FIG. 8, and therefore duplicate descriptions are omitted between the embodiments.

Hereinafter, a static electricity blocking circuit portion according to another exemplary embodiment of the present invention will be described with reference to FIG. 9 and FIG. 10. A difference with the above-described exemplary embodiment of FIG. 1 to FIG. 6 will be mainly described, and features that are the same as those described above will be omitted.

Figure 9:
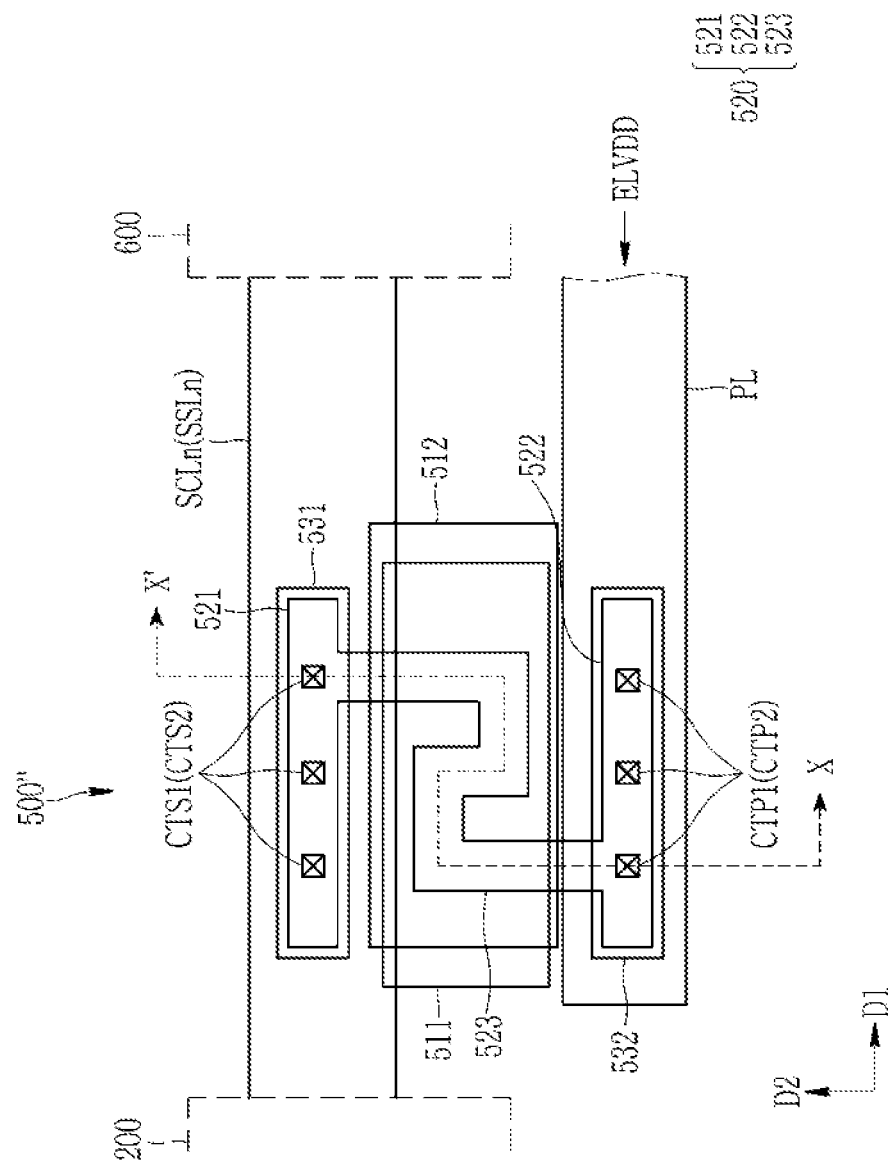
FIG. 9 is a top plan view of a static electricity blocking circuit portion according to another exemplary embodiment of the present invention.

FIG. 9 is a top plan view of a static electricity blocking circuit portion according to another exemplary embodiment of the present invention. FIG. 10 is a cross-sectional view of a static electricity blocking circuit portion of FIG. 9, taken along the line X-X'.

Figure 10:
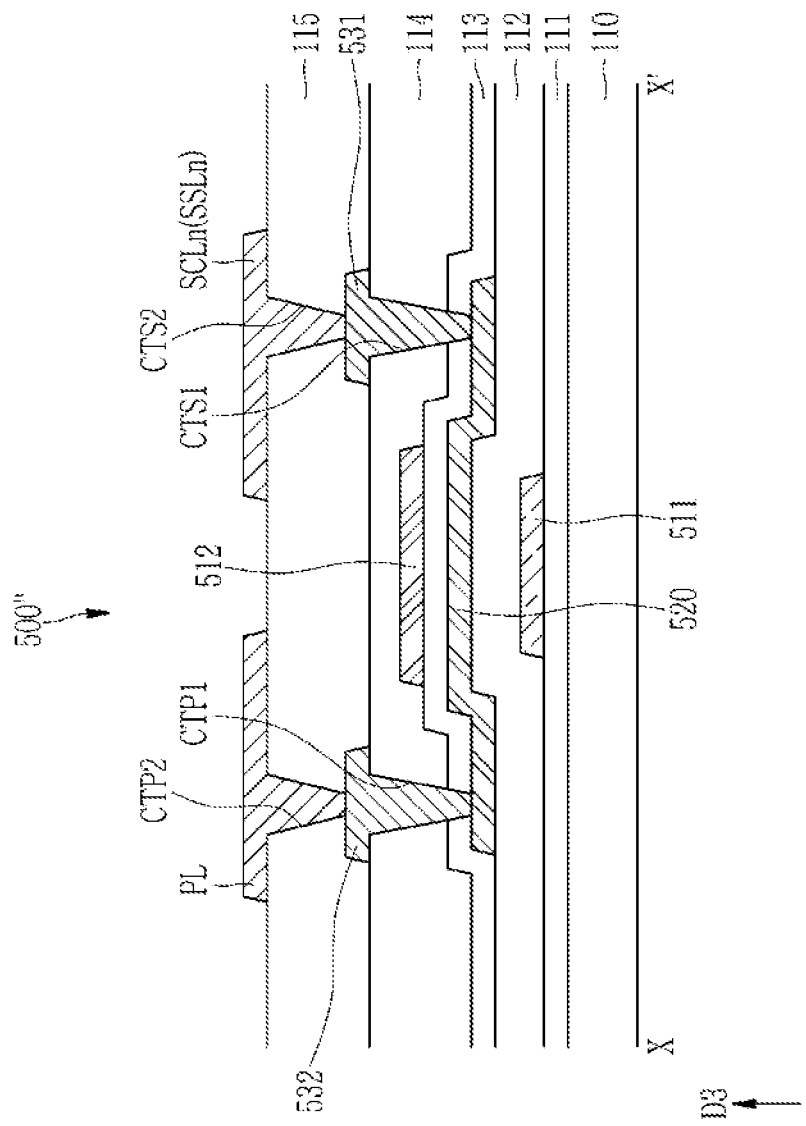
FIG. 10 is a cross-sectional view of the static electricity blocking circuit portion of FIG. 9, taken along the line X-X'.

Referring to FIG. 9 and FIG. 10, a width of a first conductive layer 511 of a static electricity blocking circuit in a second direction D2, included in a static electricity blocking circuit portion 500" according to another exemplary embodiment, is smaller than a width of a semiconductor layer 520 in the second direction D2, and the first conductive layer 511 may overlap a channel portion 523 and may not overlap a first semiconductor portion 521 and a second semiconductor portion 522. That is, the first conductive layer 511 on a plane may be disposed at a predetermined distance from the first semiconductor portion 521 and the second semiconductor portion 522 respectively between the first semiconductor portion 521 and the second semiconductor portion 522.

First signal line contact holes CTS1 and first power line contact holes CTP1 are shifted as much as a margin in a second direction D2 from predetermined locations by a process variation, and the first signal line contact holes CTS1 and the first power line contact holes CTP1 may be formed not only in a first gate insulation layer 113 and a interlayer insulation layer 114 but also in a buffer layer 112. Since the first conductive layer 511 is separated by a predetermined distance from the first semiconductor portion 521 and the second semiconductor portion 522 rather than being overlapped with first semiconductor portion 521 and the second semiconductor portion 522, a first electrode 531 and a second electrode 532 are not connected with the first conductive layer 511.

That is, although the first signal line contact holes CTS1 and the first power line contact holes CTP1 are shifted in the second direction D2 from the predetermined locations due to the process variation, a scan line SCLn (or a sensing ling SSLN) and a power line PL can be prevented from being short-circuited through the first conductive layer 511 because the first conductive layer 511 is disposed at the predetermined distance from the first semiconductor portion 521 and the second semiconductor portion 522.

Excluding such a difference, features of the exemplary embodiments described with reference to FIG. 1 to FIG. 6 can be applied to the exemplary embodiment described with reference to FIG. 9 and FIG. 10, and therefore duplicate descriptions are omitted between the embodiments.

The accompanying drawings and the detailed description of the present invention are illustrated by way of example and are not used to limit the meaning or limit the scope of the present invention described in the claims, but are used to describe the present invention. It will be understood by those skilled in the art that various changes in form and detail may be made without departing from the scope of the present invention. Accordingly, the true scope of the present invention should be determined by the technical idea of the appended claims.

What is claimed is:
1. A display device comprising:
a plurality of pixels;
a scan line connected to the plurality of pixels and extending in a first direction;
a power line configured to supply a first power source voltage to the plurality of pixels; and
a static electricity blocking circuit that connects the scan line to the power line,
wherein the static electricity blocking circuit comprises:
a first conductive layer;
a semiconductor layer that is disposed on the first conductive layer, and includes a first semiconductor portion overlapping the scan line, a second semiconductor portion overlapping the power line, and a channel portion connecting the first semiconductor portion and the second semiconductor portion with each other;
a second conductive layer disposed on the channel portion and between the first semiconductor portion and the second semiconductor portion;
a first electrode connected to the first semiconductor portion through a plurality of first signal line contact holes; and
a second electrode connected to the second semiconductor portion through a plurality of first power line contact holes, and
wherein the plurality of the first signal line contact holes are disposed closer to an outermost edge of the first semiconductor portion than an innermost edge thereof and overlap the first semiconductor portion, the plurality of first power line contact holes are disposed closer to an outermost edge of the second semiconductor portion than an innermost edge thereof and overlap the second semiconductor portion, and the second conductive layer is closer to the innermost edge of the first semiconductor portion than the outermost edge thereof and is closer to the innermost edge of the second semiconductor portion than the outermost edge thereof.

2. The display device of claim 1,
wherein the first semiconductor portion and the second semiconductor portion extend in the first direction,
the outermost edge of the first semiconductor portion and the innermost edge thereof are opposite to each other in a second direction,
the outermost edge of the second semiconductor portion and the innermost edge thereof are opposite to each other in the second direction,
the channel portion is extended from the innermost edge of the first semiconductor portion to the innermost edge of the second semiconductor portion, and
the second direction is perpendicular to the first direction.

3. The display device of claim 2,
wherein the channel portion has a zigzag-shape or an S-shape on a plane between the first semiconductor portion and the second semiconductor portion.

4. The display device of claim 1, further comprising:
a planarization layer that is disposed on the first electrode and the second electrode;
a plurality of second signal line contact holes in the planarization layer; and
a plurality of second power line contact holes in the planarization layer,
wherein the scan line is connected to the first electrode through the plurality of second signal line contact holes,
the scan line overlaps the first electrode,
the power line is connected to the second electrode through the plurality of second power line contact holes, and
the power line overlaps the second electrode.

5. The display device of claim 1,
wherein only one of the first electrode and the second electrode is connected to the first conductive layer through a corresponding contact hole of the plurality of first signal line contact holes and the plurality of first power line contact holes.

6. The display device of claim 1, further comprising:
a first gate insulation layer that is disposed on the semiconductor layer; and
an interlayer insulation layer that is disposed on the second conductive layer,
wherein the plurality of first signal line contact holes and the plurality of first power line contact holes are formed in the first gate insulation layer and the interlayer insulation layer.

7. The display device of claim 6,
wherein the second conductive layer is insulated and floated by the first gate insulation layer and the interlayer insulation layer.

8. The display device of claim 6,
wherein the scan line forms a capacitor by overlapping the second conductive layer.

9. The display device of claim 8,
wherein the semiconductor layer, the first electrode, and the second electrode form a static electricity discharge transistor having the second conductive layer as a gate electrode.

10. The display device of claim 1,
wherein the first conductive layer comprises a plurality of first openings each of which overlapping a corresponding one of the plurality of first signal line contact holes and a plurality of second openings each of which overlapping a corresponding one of the plurality of first power line contact holes.

11. The display device of claim 10, wherein a width of each of the plurality of first openings is greater than a width of each of the plurality of first signal line contact holes and a width of each of the plurality of second openings is greater than a width of each of the plurality of first power line contact holes.

12. The display device of claim 1,
wherein a width of the first conductive layer in a second direction is smaller than a width of the semiconductor layer in the second direction,
the first conductive layer is non-overlapped with each of the first electrode and the second electrode, and
the second direction is perpendicular to the first direction.

13. A display device comprising:
a display portion that includes a plurality of pixels;
a gate driver that is connected to a plurality of scan lines and a plurality of sensing lines that are connected to the plurality of pixels and extend in a first direction;
a static electricity blocking circuit portion that is disposed between the gate driver and the display portion to block introduction of static electricity into the display portion through at least one of the plurality of scan lines; and
a plurality of static electricity discharge transistors each of which connecting a corresponding one of the plurality of scan lines to a power line,
wherein each of the plurality of static electricity discharge transistors comprises:
a semiconductor layer that includes a first semiconductor portion, a second semiconductor portion, and a channel portion that connects the first semiconductor portion and the second semiconductor portion with each other;
a gate electrode that overlaps the channel portion;
a first electrode that is connected to the first semiconductor portion through a plurality of first signal line contact holes; and
a second electrode that is connected to the second semiconductor portion through a plurality of first power line contact holes,
wherein the plurality of first signal line contact holes are disposed closer to an outermost edge of the first semiconductor portion than an innermost edge thereof and overlap the first semiconductor portion,
the plurality of first power line contact holes are disposed closer to an outermost edge of the second semiconductor portion than an innermost edge thereof and overlap the second semiconductor portion, and
the gate electrode is closer to the innermost edge of the first semiconductor portion than the outermost edge thereof and is closer to the innermost edge of the second semiconductor portion than the outermost edge thereof.

14. The display device of claim 13,
wherein the first semiconductor portion and the second semiconductor portion extend in the first direction,
a first width from one of the plurality of first signal line contact holes to the innermost edge of the first semiconductor portion is greater than a second width from the one of the plurality of first signal line contact holes to the outermost edge of the first semiconductor portion, and a third width from the one of the plurality of first power line contact holes to the innermost edge of the second semiconductor portion is greater than a fourth width from the one of the plurality of first power line contact holes to the outermost edge of the second semiconductor portion.

15. The display device of claim 14,
wherein the third width is the same as the first width in size, and the fourth width is the same as the second width in size.

16. The display device of claim 13,
wherein the gate electrode is insulated and floated by an insulation layer that insulates the gate electrode.

17. The display device of claim 13, further comprising:
a first conductive layer that overlaps the semiconductor layer, the gate electrode, the first electrode, and the second electrode,
wherein the semiconductor layer is interposed between the first conductive layer and the gate electrode.

18. The display device of claim 17,
wherein only one of the first electrode and the second electrode is connected to the first conductive layer through a corresponding contact hole of the plurality of first signal line contact holes and the plurality of first power line contact holes.

19. The display device of claim 17,
wherein the first conductive layer comprises a plurality of first openings each of which overlapping a corresponding one of the plurality of first signal line contact holes and a plurality of second openings each of which overlapping a corresponding one of the plurality of first power line contact holes.

20. The display device of claim 19,
wherein a width of each of the plurality of first openings is greater than a width of the first semiconductor portion and a width of each of the plurality of second openings is greater than a width of the second semiconductor portion.

* * * * *